US010715087B2

(12) United States Patent
Banerjee et al.

(10) Patent No.: US 10,715,087 B2
(45) Date of Patent: Jul. 14, 2020

(54) CMOS WIDEBAND RF AMPLIFIER WITH GAIN ROLL-OFF COMPENSATION FOR EXTERNAL PARASITICS

(71) Applicant: Indian Institute of Science, Bangalore, Karnataka (IN)

(72) Inventors: Gaurab Banerjee, Karnataka (IN); Arnab Chakraborty, Karnataka (IN); Jaideep Chauhan, Karnataka (IN)

(73) Assignee: Indian Institute of Science, Bangalore (IN)

( * ) Notice: Subject to any disclaimer, the term of this patent is extended or adjusted under 35 U.S.C. 154(b) by 149 days.

(21) Appl. No.: 15/744,155

(22) PCT Filed: Jul. 1, 2016

(86) PCT No.: PCT/IB2016/053972
§ 371 (c)(1),
(2) Date: Jan. 12, 2018

(87) PCT Pub. No.: WO2017/009733
PCT Pub. Date: Jan. 19, 2017

(65) Prior Publication Data
US 2019/0013781 A1    Jan. 10, 2019

(30) Foreign Application Priority Data
Jul. 16, 2015 (IN) .......................... 3648/CHE/2015

(51) Int. Cl.
*H03F 3/60* (2006.01)
*H03F 1/08* (2006.01)
(Continued)

(52) U.S. Cl.
CPC ............ *H03F 1/083* (2013.01); *H03F 1/086* (2013.01); *H03F 1/223* (2013.01); *H03F 1/56* (2013.01);
(Continued)

(58) Field of Classification Search
CPC . H03F 1/083; H03F 3/605; H03F 1/56; H03F 1/223; H03F 3/607; H03F 3/195; H03F 1/086
(Continued)

(56) References Cited

U.S. PATENT DOCUMENTS

| 2008/0204148 A1* | 8/2008 | Kim ........................ H03F 1/223 330/306 |
| 2009/0079524 A1 | 3/2009 | Cyr et al. |
| 2012/0229216 A1* | 9/2012 | Benson .................... H03F 1/086 330/291 |

FOREIGN PATENT DOCUMENTS

EP        2498399 A2        9/2012

OTHER PUBLICATIONS

"International Search Report" issued in PCT/IB2016/053972, dated Dec. 23, 2016, 3 pages.

* cited by examiner

*Primary Examiner* — Khanh V Nguyen
*Assistant Examiner* — Khiem D Nguyen
(74) *Attorney, Agent, or Firm* — Kilpatrick Townsend & Stockton, LLP

(57) ABSTRACT

The present disclosure relates to an integrated wideband Radio Frequency (RF) amplifier, based on a complementary metal oxide semiconductor (CMOS) technology. In an embodiment the amplifier addresses the shortcomings of conventional wideband amplifiers and is based on a distributed amplifier (DA) topology which typically exhibit severe performance degradation when externally loaded with parasitic circuit elements. In an embodiment of the present invention a buffer amplifier at the output of a conventional DA is able to compensate the impact of parasitic elements. The disclosed circuit can be implemented by fabricating the wideband RF amplifier integrated circuit (IC) on a 130 nm
(Continued)

CMOS technology or other comparable CMOS technologies.

8 Claims, 7 Drawing Sheets

(51) Int. Cl.
  *H03F 3/195* (2006.01)
  *H03F 1/22* (2006.01)
  *H03F 1/56* (2006.01)
(52) U.S. Cl.
  CPC ............. *H03F 3/195* (2013.01); *H03F 3/605* (2013.01); *H03F 3/607* (2013.01); *H03F 2200/165* (2013.01); *H03F 2200/315* (2013.01); *H03F 2200/387* (2013.01); *H03F 2200/411* (2013.01); *H03F 2200/451* (2013.01)
(58) Field of Classification Search
  USPC .......................................... 330/286, 310, 311
  See application file for complete search history.

CMOS WIDEBAND RF AMPLIFIER WITH GAIN ROLL-OFF COMPENSATION FOR EXTERNAL PARASITICS

TECHNICAL FIELD

The present disclosure generally relates to the field of Integrated Circuit design. In particular it pertains to a wideband Radio Frequency (RF) Amplifier on a semiconductor chip with μ-Nano device technology.

BACKGROUND

Background description includes information that may be useful in understanding the present invention. It is not an admission that any of the information provided herein is prior art or relevant to the presently claimed invention, or that any publication specifically or implicitly referenced is prior art.

It is known that high bandwidth amplifiers, whose range of coverage spans several tens of GHz, have many applications in wideband RF receivers, because they enable the simultaneous reception of signals transmitted on many frequencies. A popular design choice in such applications is the distributed amplifier.

Integrated circuit (IC) based Radio Frequency (RF) amplifiers are used in many transmitter and receiver systems for the amplification and filtering of RF signals sometimes exceeding frequencies of several tens of Giga Hertz. Such amplifiers are often used together with other external components, such as, capacitors, inductors, mixers, filters, diplexers, etc. on a printed circuit board (PCB) assembly.

A typical configuration of integrated circuit based complementary metal-oxide semiconductor (CMOS) amplifier 110 assembled on a PCB assembly 100 is shown in FIG. 1A. On the integrated circuit interface, a wire-bond 102 connects a bond pad on the IC 104 to a corresponding pad on the PCB 106. This electrical connection is then continued on, using a trace on the PCB 108. As shown in FIG. 1B, several such ICs 152-1, 152-2 may be connected on the PCB assembly 150, along with other components such as mixers 154, filters 156 and diplexers 158. Every IC or component on the PCB assembly is connected to interconnecting traces using wire-bonds and pads as described in FIG. 1A. In one embodiment, the PCB (100) may be replaced by a substrate in an integrated circuit package, with the external connections (102, 104, 106, 108) remaining the same. These connections result in additional capacitance, inductance and resistance being added to the amplifier interface, which greatly degrade its high frequency performance metrics such as gain, bandwidth and power reflections.

Distributed amplifiers that incorporate transmission line theory into traditional amplifier design to obtain a larger gain-bandwidth product than is realizable by conventional circuits, are commonly used for broadband amplifiers. The distributed amplifier work on the principle of delaying an incoming signal and passing it through individual gain stages, and combining all the corresponding outputs to provide gain and a very large bandwidth. Its biggest shortcoming is that if the terminations or resistive loads do not provide appropriate matching for the traveling waves, the performance gets severely degraded due to reflections. As shown in FIG. 1A, the wire-bonds and the interface pads (also known as package parasitics) result in such reflections, resulting in severe performance impairment.

The extent of performance degradation of a typical CMOS based 5 stage distributed amplifier due to package parasitics is apparent from FIG. 2 which illustrates simulation results of a distributed amplifier in absence of package parasitic (curve 202) and in presence of parasitic elements (curve 204). It is apparent from curve 202 and 204 that in absence of package parasitic gain 's$_{21}$' is 5 dB at 17 GHz, while in presence of parasitic elements, the gain falls to 0 dB at that frequency. Equivalently, the bandwidth for 5 dB or more decreases from 17 GHz to 10 GHz. This is considered significant performance degradation in a wideband RF communication system.

There is therefore a need for a wideband RF amplifier circuit that is easy to implement and the where high frequency performance is not affected due to the impact of external parasitic elements.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

OBJECTS OF THE INVENTION

An object of the present disclosure is to overcome problems associated with existing technologies related to wideband RF amplifier.

Another object of the present disclosure is to provide a circuit for wideband RF amplifier that is robust to the impact of external parasitic elements.

Another object of the present disclosure is to provide a circuit for wideband RF amplifier that can compensate the high frequency performance degradation of the DA caused by the package parasitics.

Another object of the present disclosure is to provide a circuit for wideband RF amplifier that can be designed to have, without parasitics, a positive gain slope at higher frequencies such that upon insertion of parasitics, the amplifier exhibits a flat frequency response.

Another object of the present disclosure is to provide a circuit for wideband RF amplifier with improved gain.

Another object of the present disclosure is to provide a circuit for wideband RF amplifier with improved bandwidth.

Another object of the present disclosure is to provide a circuit for wideband RF amplifier that can compensate the high frequency performance degradation of the DA caused by the package parasitics.

Another object of the present disclosure is to provide a circuit for wideband RF amplifier which can be fabricated in 130 nm or other comparable CMOS technologies such as 350-nm, 250-nm, 180-nm, 90-nm. 65-nm, 32-nm and so on Another object of the present disclosure is to provide wideband RF amplifier with a simple circuit.

SUMMARY

Aspects of present disclosure relate to a wideband RF amplifier. In an aspect the disclosure provides a circuit for wideband RF amplifier that is much more robust to the impact of external parasitic elements and can significantly enhance the bandwidth without degradation in the gain.

In an embodiment the present disclosure provides a wideband RF amplifier on a chip that incorporates a distributed amplifier (DA) and a buffer amplifier. In an aspect, the disclosed RF amplifier is a cascaded connection of the DA and the buffer amplifier. In another aspect, the buffer amplifier inserted between the output of the distributed amplifier and the interface packaging elements such as wire-bonds, pads, PCB traces, etc. can compensate for the high frequency performance degradation of the DA due to these interface packaging elements.

In another embodiment, a conventional distributed amplifier (DA) comprising plurality of gain stages with modifications to topology of these gain stages for performance improvement can be used as basic building block of the disclosed wideband amplifier. In an embodiment, the distributed amplifier (DA) can be made up of a number of identical gain stages wherein each of the gain stages is implemented as cascode connection of two transistors with an intermediate inductor. Input of each of these stages can be connected at a transmission line—'gate-line' and corresponding outputs connected to another transmission line—'drain-line'. In an alternate embodiment the gain stages can have other topology such as "common source amplifier" topology.

In an embodiment, the buffer amplifier inserted between the output of the distributed amplifier and the interface packaging elements can consist of two cascode stages that are biased on the drain side with resonant networks to provide a DC operating current and RF isolation. In addition, three resonant networks can be used to provide input, interstage and output matching respectively.

In an aspect, the disclosed wideband RF amplifier without parasitics, can be designed to have a positive gain slope at higher frequencies by exploiting the resonant nature of the buffer amplifier. When the parasitics are inserted, the amplifier can exhibit a flat frequency response, with significantly enhanced gain and bandwidth.

In an embodiment, the resulting CMOS based integrated circuit, can be fabricated in a 130 nm technology or other comparable CMOS technologies. In an aspect, a wideband RF amplifier fabricated using 130 nm technology has exhibited marked improvement in performance when evaluated for gain and bandwidth.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION

Figure 1A:
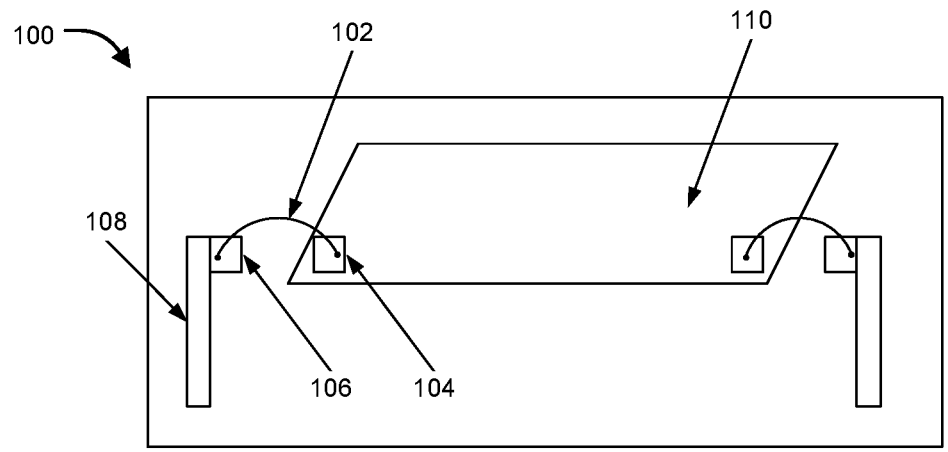
FIG. 1A and FIG. 1B illustrate a typical configuration of a RF amplifier assembly with parasitic elements.
Figure 1B:
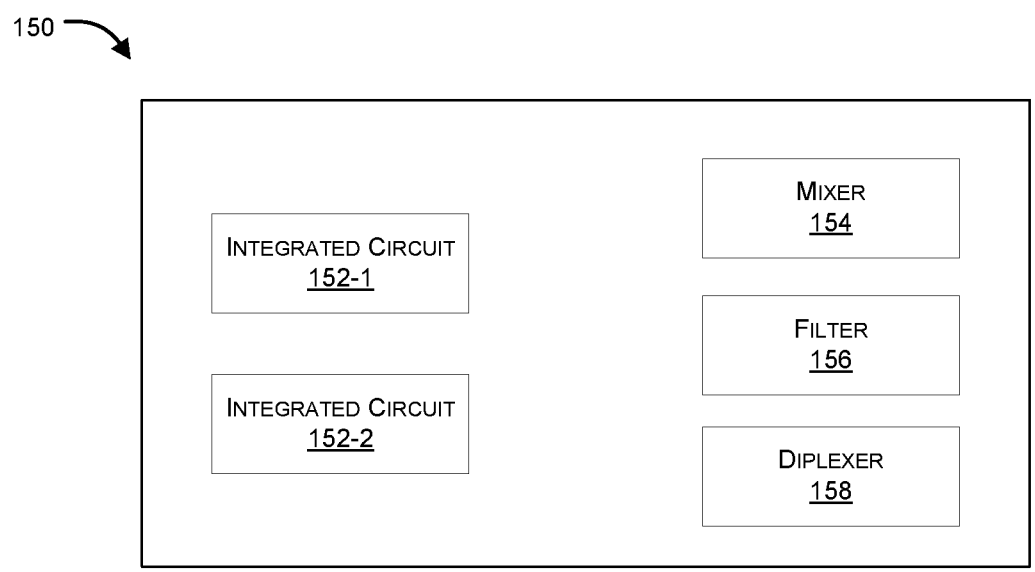
Figure 2:
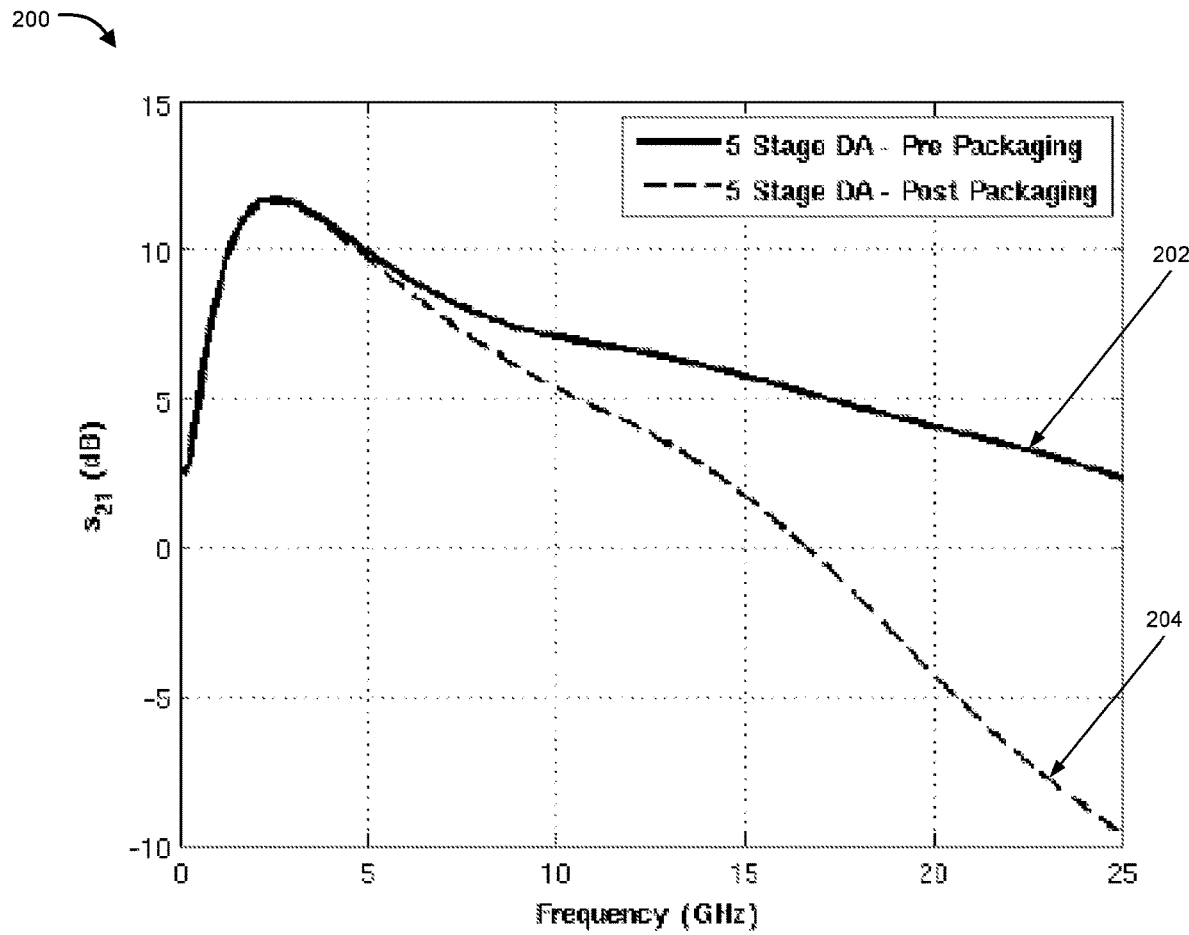
FIG. 2 illustrates simulation graphs of a typical distributed amplifier showing its performance degradation due to package parasitics.

The following is a detailed description of embodiments of the disclosure depicted in the accompanying drawings. The embodiments are in such detail as to clearly communicate the disclosure. However, the amount of detail offered is not intended to limit the anticipated variations of embodiments;

on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Various terms as used herein are shown below. To the extent a term used in a claim is not defined below, it should be given the broadest definition persons in the pertinent art have given that term as reflected in printed publications and issued patents at the time of filing.

Embodiments of the present disclosure relate to a CMOS wideband RF amplifier integrated circuit chip that incorporates a distributed amplifier (DA) and a buffer amplifier wherein the distributed amplifier (DA) and the buffer amplifier are arranged in a cascaded connection. In an aspect the buffer amplifier inserted between the output of the distributed amplifier and the interface packaging elements such as wire-bonds, pads, PCB traces, etc. can compensate for the high frequency performance degradation of the DA due to these interface packaging elements.

In another embodiment, a conventional distributed amplifier (DA) comprising plurality of gain stages incorporating modified topology for performance improvement can be used as basic building block of the disclosed wideband amplifier.

In an embodiment, the distributed amplifier (DA) can be made up of a number of identical gain stages wherein each of the gain stages is implemented as cascode connection of two transistors with an intermediate inductor. Input of each of these stages can be connected at a transmission line—'gate-line' and corresponding outputs connected to another transmission line—'drain-line'. In an alternate embodiment the gain stages can have other topology such as "common source amplifier" topology.

In an embodiment, the buffer amplifier inserted between the output of the distributed amplifier and the interface packaging elements can consist of two cascode stages that are biased on the drain side with resonant networks to provide a DC operating current and RF isolation. In addition, three resonant networks can be used to provide input, interstage and output matching respectively.

In aspect, the disclosed wideband RF amplifier without parasitics, can be designed to have a positive gain slope at higher frequencies by exploiting the resonant nature of the buffer amplifier. When the parasitics are inserted, the amplifier can exhibit a flat frequency response, with significantly enhanced gain and bandwidth.

In an embodiment, the resulting CMOS based integrated circuit, can be fabricated in a 130 nm technology or other comparable CMOS technologies. In an aspect, a wideband RF amplifier fabricated using 130 nm technology has exhibited marked improvement in performance when evaluated for gain and bandwidth.

It is known that a distributed amplifier provides a bandwidth depending on the arrangement of a ladder filter having the transistors with input capacitance and the transmission wires with inductance, and that the distributed amplifiers are suitable for a broadband amplifier. In recent years, the major trend for such broadband amplifier is a cascode distributed amplifier in which a plurality of unit circuits each including grounded-gate transistors are connected in parallel. Use of a cascode distributed amplifier allows generation of a negative-polarity resistance in a high frequency band by a circuit element connected to the grounded-gate transistor of each unit circuit, and provides broadband amplification.

Figure 3:
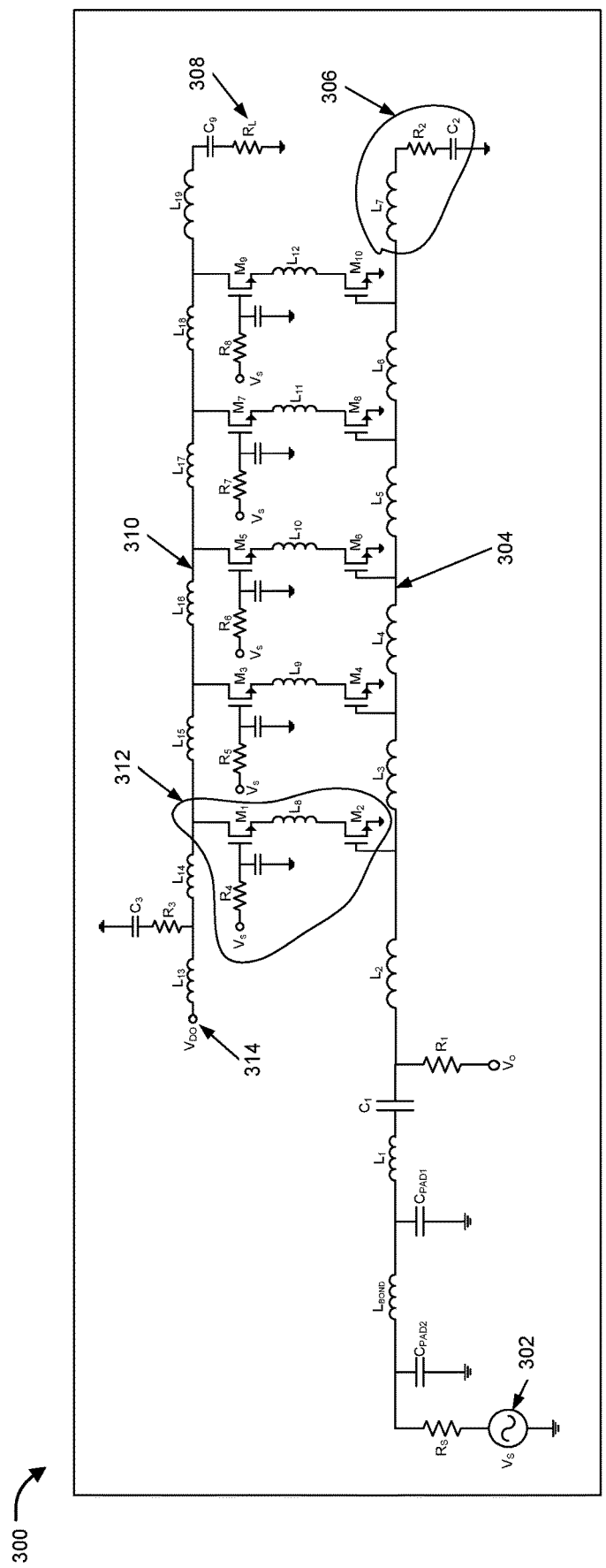
FIG. 3 illustrates an exemplary configuration of a distributed amplifier in accordance with embodiments of the present disclosure.

Referring now to FIG. 3 wherein a distributed amplifier 300 that is used as basic building block of the disclosed wideband RF amplifier is illustrated. The distributed amplifier 300 can comprise a number of identical gain stages 312, each of these identical gain stages can be a single phase gain stage, connected at the input to a transmission line, known as the "gate-line" 304, and the corresponding outputs connected to another transmission line, known as the "drain-line" 310. These transmission lines can be implemented with multiple inductors and device junction capacitors, as shown in the FIG. 3.

In an embodiment, the gain stage 312 can be implemented as a "cascode" connection of two transistors with an intermediate inductor. In alternate embodiments, the gain stage can have other amplifier topology, such as a "common source amplifier". One end of the gate line can be connected to the input with other end terminated with a network 306 wherein network 306 can be made up of a resistor in series with an inductor and a capacitor. The drain line can be connected to the power supply at one end 314 and terminated at output, with a load resistor 308.

In the cascode distributed amplifier of the present invention, each of the gain stages can comprise a pair of first and second transistor connected in cascode between an input transmission line and an output transmission line wherein the first transistor can have its gate connected to the input transmission line, source grounded and drain connected to the second transistor with an intermediate inductor; and the second transistor can have its gate connected to an input filter and drain connected to the output transmission line. The intermediate inductor can be provided in each of the gain stages. In an aspect, the intermediate inductor functions to provide a stable amplification even when the input signal frequency is in the high frequency range. The gain stages can be single phase stages which can provide a constant phase shift to achieve stable amplification.

As is known in the art, a distributed amplifier works on the principle of delaying an incoming signal and passing it through individual gain stages such as 312, and combining all the corresponding outputs to provide gain and a very large bandwidth. Its biggest shortcoming is that if the terminations or resistive loads 308, 306, do not provide appropriate matching for the traveling waves, the performance is severely degraded due to reflections. As shown in FIG. 1A, the wire-bonds and the interface pads also known as package parasitic, result in such reflections, resulting is severe performance impairment. For a CMOS based distributed amplifier 300 that has been designed as a starting point for this invention, the gain '$s_{21}$' can be 5 dB at 17 GHz in absence of package parasitic, while in presence of parasitic elements, the gain can fall to 0 dB at that frequency. Equivalently, the bandwidth for 5 dB decreases from 17 GHz to 10 GHz. This is considered significant performance degradation in a wideband RF communication system.

In an embodiment the disclosure provides a novel circuit which provides a buffer amplifier inserted between the DA 300 and the external parasitic elements to reduce the performance degradation. In an aspect, the DA and the buffer amplifier can be configured in a cascaded connection. The resulting wideband RF amplifier is much more robust to the impact of external parasitic elements. The gain and the bandwidth degradation of this amplifier, due to external parasitics, are substantially alleviated.

Figure 4:
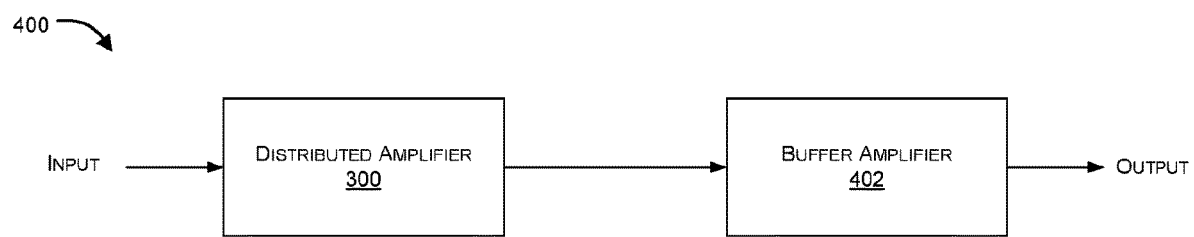
FIG. 4 illustrates an exemplary configuration of the distributed amplifier with a buffer amplifier in accordance with embodiments of the present disclosure.

FIG. 4 illustrates an exemplary schematic diagram of a wideband RF amplifier 400 in accordance with embodiments of the present disclosure. As shown in FIG. 4 the wideband RF amplifier 400 can be a cascaded connection of the distributed amplifier 300, and a buffer amplifier 402 such that the buffer amplifier 402 is inserted between the output of the distributed amplifier 300 and the interface packaging elements for example wire-bonds, pads, PCB etc. Such an arrangement for the wideband RF amplifier 400 can compensate for the high frequency performance degradation of the DA and therefore is much more robust to the impact of external parasitic elements. Further the wideband RF amplifier 400 is a CMOS based integrated circuit that can be fabricated in 130 nm or other comparable CMOS technologies such as 350-nm, 250-nm, 180-nm, 90-nm.

Figure 5:
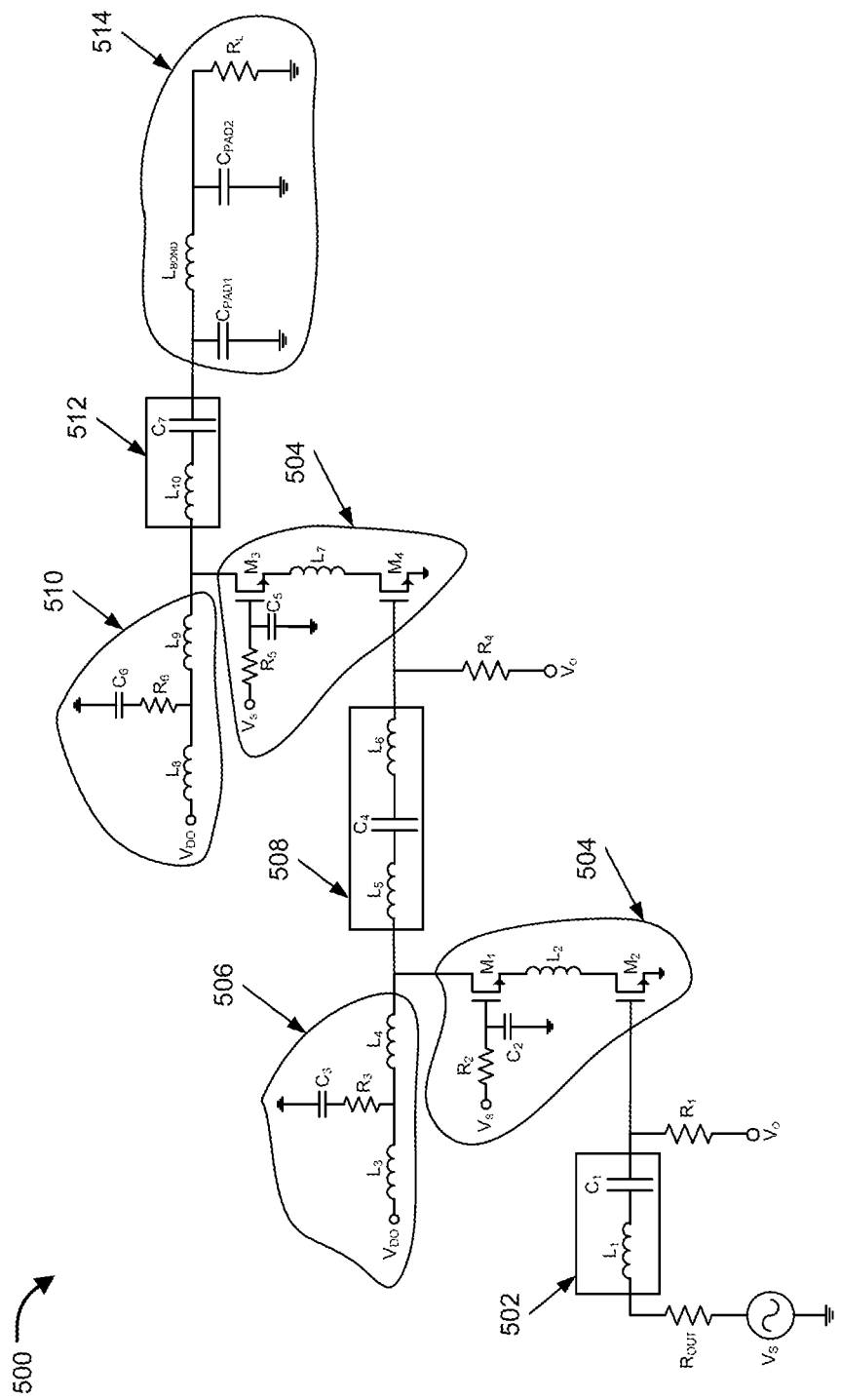
FIG. 5 illustrates an exemplary circuit diagram of the disclosed buffer amplifier with resonance circuit in accordance with embodiments of the present disclosure.

In an embodiment, the disclosure provides a buffer amplifier that comprises multistage gain circuitry that can be flexible in design topology. The multistage gain circuitry can have unity gain and can provide perfectly matching condition. FIG. 5 illustrates an exemplary circuit 500 in the form of a diagram of the buffer amplifier 402, that can be inserted between the DA 300 and the external parasitics (represented by 514 in the circuit) to reduce the performance degradation due to package parasitics. The buffer can consist of two cascode gain stages 504, which may or may not be identical to the ones used in the DA, in terms of transistor size or bias conditions. These gain stages 504 can be biased on the drain side with resonant networks 506/510 to provide a DC operating current and RF isolation. In addition, three resonant networks 502, 508, 512 can be used to provide input, inter-stage and output matching respectively. The individual components in all these networks can be tuned for wideband gain and compensate the effect of the external parasitics.

In an embodiment, the disclosed wideband RF amplifier 400 can be designed to have a positive gain slope at higher frequencies without parasitics by exploiting the resonant nature of the buffer amplifier 402. When the parasitics are inserted, the amplifier 400 can exhibit a flat frequency response, with significantly enhanced gain and bandwidth.

Figure 6:
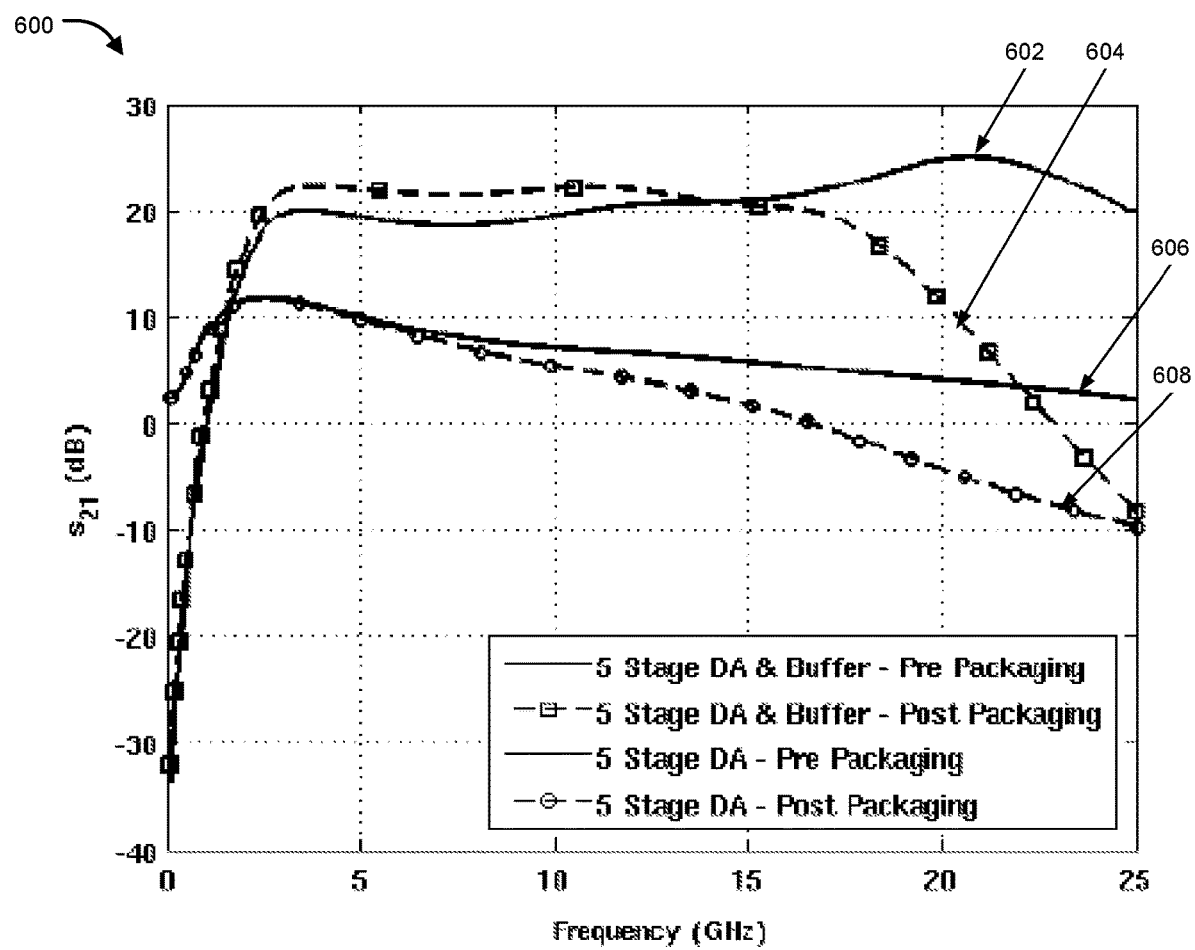
FIG. 6 illustrates exemplary gain curves of the disclosed wideband RF amplifier before and after insertion of the buffer amplifier in accordance with embodiments of the present disclosure.

FIG. 6, illustrates impact of inserting the buffer amplifier 402 on performance of the wideband amplifier 400, and compares it with the performance of distributed amplifier with and without parasitics. Curve 602 shows the gain-frequency response of the disclosed distributed amplifier 400 (cascaded with buffer amplifier 402) without parasitics. As can be seen the curve 602 exhibits a positive slope at higher frequencies. This characteristic has been achieved by exploiting the resonant nature of the buffer amplifier 402. The gain-frequency response of the distributed amplifier 400 after insertion of parasitics is shown by curve 604. As can be seen, the amplifier 400 now exhibits a flat frequency response, with significantly enhanced gain and bandwidth as compared to gain-frequency response of the parasitically loaded distributed amplifier 300 as shown by the curve 608. As can be appreciated the disclosed configuration of the distributed amplifier 300 and the buffer amplifier 402 has resulted in significant improvement in the performance and has been able to alleviate degradation due to package parasitics.

In an aspect, the disclosed amplifier 400 can achieve bandwidth in the range of several tens of GHz such as 0.2 to 20 GHz.

Figure 7:
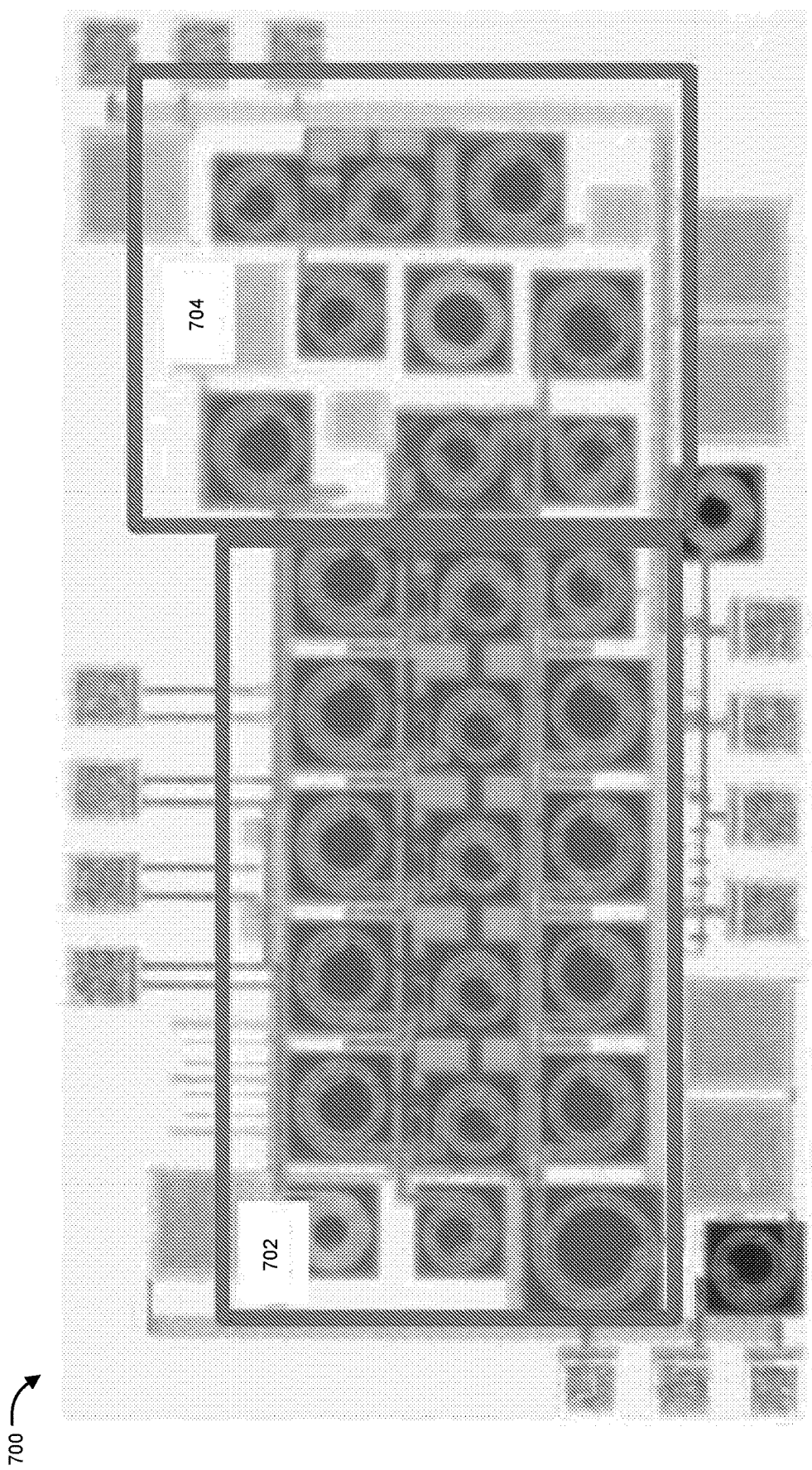
FIG. 7 illustrates an exemplary photomicrograph of CMOS wideband RF amplifier, showing the 5-stage DA and the buffer amplifier in accordance with embodiments of the present disclosure.

FIG. 7 illustrates an exemplary photomicrograph 700 of a CMOS wideband RF amplifier 400 in accordance with embodiments of the present disclosure. The photomicrograph 700 shows the DA 702 comprising of 5-stages and the buffer amplifier 704. As shown, the disclosed wideband RF amplifier 400 can be implemented and fabricated as a CMOS chip. The fabrication of wideband RF amplifier integrated circuit (IC) can be done using 130 nm CMOS technology or other comparable CMOS technologies such as 350-nm, 250-nm, 180-nm, 90-nm.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

ADVANTAGES OF THE INVENTION

The present disclosure overcomes problems associated with existing technologies related to wideband RF amplifier.

The present disclosure provides a circuit for wideband RF amplifier that is robust to the impact of external parasitic elements.

The present disclosure provides a circuit for wideband RF amplifier that can compensate the high frequency performance degradation of the DA caused by the package parasitics.

The present disclosure provides a circuit for wideband RF amplifier that can be designed to have, without parasitics, a positive gain slope at higher frequencies such that upon insertion of parasitics, the amplifier exhibits a flat frequency response.

The present disclosure provides a circuit for wideband RF amplifier with improved gain.

The present disclosure provides a circuit for wideband RF amplifier with improved bandwidth.

The present disclosure provides a circuit for wideband RF amplifier that can compensate the high frequency performance degradation of the DA caused by the package parasitics.

The present disclosure provides a circuit for wideband RF amplifier which can be fabricated in 130 nm technology.

The present disclosure provides a wideband RF amplifier with a simple circuit.

We claim:
1. A wideband RF amplifier comprising:
    a distributed amplifier comprising plurality of first gain stages, wherein each of the first gain stages comprises a first and a second transistor connected in cascode between an input transmission line and an output transmission line, wherein gate of the first transistor is connected to the input transmission line and source of the first transistor is grounded and drain of the first transistor is connected to the second transistor with an intermediate inductor, and wherein gate of the second transistor is connected to an input filter and drain of the second transistor is connected to the output transmission line; and a buffer amplifier cascaded with the distributed amplifier, wherein the buffer amplifier is connected between the distributed amplifier and external parasitic elements, wherein the buffer amplifier comprises a plurality of second gain stages, and wherein each of the second gain stages comprises a pair of a third and a fourth transistor connected in cascode with an intermediate inductor, wherein the buffer amplifier incorporates one or more resonant networks and wherein the one or more resonant networks are designed to provide a positive gain slope at higher frequencies, wherein the positive gain slope at higher frequencies compensates for higher frequency performance degradation of the distributed amplifier due to external parasitic elements.

2. The amplifier of claim 1, wherein each of the plurality of first gain stages has common source amplifier topology.

3. The amplifier of claim 1, wherein said plurality of second gain stages are biased on drain side with the one or more resonant networks to provide a DC operating current and RF isolation.

4. The amplifier of claim 1, wherein the one or more resonant networks provide matching at input, inter-stage and output side.

5. The amplifier of claim 1, wherein the one or more resonant networks comprise inductor and capacitor and are tuned for wideband gain and to compensate effect of external parasitic.

6. The amplifier of claim 1, wherein band width of the amplifier is in the range of several tens of GHz such as 0.2 to 20 GHz.

7. The amplifier of claim 1, wherein the distributed amplifier and the buffer amplifier are fabricated on a CMOS chip.

8. The amplifier of claim 7, wherein said CMOS chip is fabricated using 130 nm technology or other comparable CMOS technologies.

* * * * *